United States Patent
Adams et al.

(10) Patent No.: US 7,737,050 B2
(45) Date of Patent: Jun. 15, 2010

(54) METHOD OF FABRICATING A NITRIDED SILICON OXIDE GATE DIELECTRIC LAYER

(75) Inventors: Edward Dennis Adams, Richmond, VA (US); Jay Sanford Burnham, Fletcher, VT (US); Evgeni Gousev, Saratoga, CA (US); James Spiros Nakos, Essex Junction, VT (US); Heather Elizabeth Preuss, Milton, VT (US); Joseph Francis Shepard, Jr., Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 592 days.

(21) Appl. No.: 11/554,097

(22) Filed: Oct. 30, 2006

(65) Prior Publication Data

US 2008/0102650 A1 May 1, 2008

(51) Int. Cl.
*H01L 21/31* (2006.01)
*H01L 21/467* (2006.01)
(52) U.S. Cl. ..................... 438/770; 438/775
(58) Field of Classification Search .............. None
See application file for complete search history.

(56) References Cited

U.S. PATENT DOCUMENTS

| | | | |
|---|---|---|---|
| 5,478,765 A * | 12/1995 | Kwong et al. | 438/762 |
| 5,972,800 A * | 10/1999 | Hasegawa | 438/761 |
| 6,780,720 B2 | 8/2004 | Burnham et al. | |
| 6,808,993 B2 | 10/2004 | Finnie et al. | |
| 2003/0181012 A1 | 9/2003 | Wang et al. | |
| 2004/0248392 A1 | 12/2004 | Narwankar et al. | |
| 2005/0012164 A1 | 1/2005 | Tsai | |
| 2005/0032345 A1 | 2/2005 | Kryliouk et al. | |

\* cited by examiner

*Primary Examiner*—Zandra Smith
*Assistant Examiner*—Pamela E Perkins
(74) *Attorney, Agent, or Firm*—Schmeiser, Olsen & Watts; W. Riyon Harding

(57) ABSTRACT

A method of forming a nitrided silicon oxide layer. The method includes: forming a silicon dioxide layer on a surface of a silicon substrate; performing a rapid thermal nitridation of the silicon dioxide layer at a temperature of less than or equal to about 900° C. and a pressure greater than about 500 Torr to form an initial nitrided silicon oxide layer; and performing a rapid thermal oxidation or anneal of the initial nitrided silicon oxide layer at a temperature of less than or equal to about 900° C. and a pressure greater than about 500 Torr to form a nitrided silicon oxide layer. Also a method of forming a MOSFET with a nitrided silicon oxide dielectric layer.

45 Claims, 2 Drawing Sheets

US 7,737,050 B2

METHOD OF FABRICATING A NITRIDED SILICON OXIDE GATE DIELECTRIC LAYER

FIELD OF THE INVENTION

The present invention relates to the manufacture of semiconductor devices; more specifically, it relates to a method of fabricating a nitrided silicon oxide layer.

BACKGROUND OF THE INVENTION

The trend in integrated circuits is toward higher performance, higher speed and lower cost. Correspondingly, device dimensions and element sizes are shrinking and gate dielectrics must scale accordingly. As physical gate dielectric thickness has decreased, the need for a higher dielectric constant and less leaky gate dielectric has arisen. In advanced metal oxide semiconductor field effect transistors (MOSFETs) nitrided silicon oxide layers are used as a gate dielectric. MOSFET transistors include a channel region formed in silicon, an N or P doped polysilicon gate formed on top of a thin gate dielectric layer and aligned over the channel region, and source/drain regions formed in the silicon on either side of the channel region.

However, a problem with nitrided silicon oxide layers is thickness variation across the wafer, particularly as the gate dielectric thickness decreases. Across wafer thickness variation of the gate dielectric leads directly to across wafer threshold voltage variation causing variations in performance of individual integrated circuit chips from the same wafer. Therefore, there is a need for a method of fabricating a nitrided silicon oxide layer having a relatively uniform across wafer thickness.

SUMMARY OF THE INVENTION

A first aspect of the present invention a method, comprising: forming a silicon dioxide layer on a surface of a silicon substrate; performing a rapid thermal nitridation of the silicon dioxide layer at a temperature of less than or equal to about 900° C. and a pressure greater than about 500 Torr to form an initial nitrided silicon oxide layer; and performing a rapid thermal oxidation or anneal of the initial nitrided silicon oxide layer at a temperature of less than or equal to about 900° C. and a pressure greater than about 500 Torr to form a nitrided silicon oxide layer.

A second aspect of the present invention is the first aspect, wherein the performing the rapid thermal nitridation is performed in an atmosphere containing ammonia.

A third aspect of the present invention is the first aspect, wherein the performing the rapid thermal nitridation is performed in an essentially 100% ammonia atmosphere.

A fourth aspect of the present invention is the first aspect, wherein the performing the rapid thermal oxidation or anneal is performed in a nitrogen atmosphere containing about 10% by volume or less of oxygen.

A fifth aspect of the present invention is the first aspect, wherein the performing the rapid thermal oxidation or anneal is performed in an essentially 100% nitrogen atmosphere.

A sixth aspect of the present invention is the first aspect, wherein the rapid thermal nitridation is performed without the use of a plasma.

A seventh aspect of the present invention is the first aspect, wherein the rapid thermal oxidation or anneal is performed without the use of a plasma.

An eighth aspect of the present invention is the first aspect, wherein the silicon dioxide layer has a thickness between about 11 Å and about 16 Å.

A ninth aspect of the present invention is the first aspect, wherein the nitrided silicon oxide layer has a thickness between about 11 Å and about 16 Å.

A tenth aspect of the present invention is the first aspect, wherein between about 2% and about 20% of all atoms of the nitrided silicon oxide layer are nitrogen atoms.

An eleventh aspect of the present invention is the first aspect, wherein between about 6% and about 8% of all atoms of the nitrided silicon oxide layer are nitrogen atoms.

A twelfth aspect of the present invention is the first aspect, wherein a nitrogen concentration of the nitrided silicon oxide layer is between about 1E21 and about 1E22 atm/cm$^3$.

A thirteenth aspect of the present invention is the first aspect, when a thickness of the silicon dioxide layer is not greater than about 13 Å, the performing the rapid thermal nitridation is performed at a temperature of between about 825° C. and about 885° C. and at a pressure of between about 720 and about 760 Torr in an ammonia containing atmosphere and the performing the rapid thermal oxidation or anneal is performed at a temperature of between about 875° C. and about 895° C. and at a pressure of between about 720 and about 760 Torr in an oxygen atmosphere.

A fourteenth aspect of the present invention is the thirteenth aspect. The method of claim 13, further including: measuring the thickness of the silicon dioxide layer.

A fifteenth aspect of the present invention is the first aspect, when a thickness of the silicon dioxide layer is greater than or equal to about 13 Å, the performing the rapid thermal nitridation is performed at a temperature of between about 850° C. and about 900° C. and at a pressure of between about 720 and about 760 Torr in an ammonia containing atmosphere and the performing the rapid thermal oxidation or anneal is performed at a temperature of between about 850° C. and about 900° C. and at a pressure of between about 720 and about 760 Torr in an nitrogen atmosphere containing no more than about 10% by volume of oxygen.

A sixteenth aspect of the present invention is the fifteenth aspect, further including: measuring the thickness of the silicon dioxide layer.

A seventeenth aspect of the present invention is the first aspect, wherein the forming the silicon dioxide layer includes performing an initial rapid thermal oxidation.

An eighteenth aspect of the present invention is the seventeenth aspect, wherein the initial rapid thermal oxidation is performed at a temperature of between about 900° C. and about 1100° C. and at a pressure of between about 100 and 140 Torr in an ammonia containing atmosphere containing between about 10% by volume oxygen in nitrogen and about 100% oxygen.

A nineteenth aspect of the present invention is the first aspect, wherein the forming the silicon dioxide layer includes performing a thermal oxidation of the silicon substrate.

A twentieth aspect of the present invention is the first aspect, further including:

forming a gate electrode over the nitrided silicon oxide layer; and forming source/drains of a MOSFET in the silicon substrate on opposite sides of the gate electrode, the source drains separated by a channel region of the MOSFET, the channel region located in the substrate under the gate electrode.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The term silicon oxynitride, nitrided $SiO_2$, nitrided silicon oxide or $SiO_xN_y$ (which may be used interchangeably) refer to a $SiO_2$ layer into which nitrogen has been introduced. The terms nitrided silicon oxide and the formula $SiO_xN_y$ will be use hereinafter to denote a $SiO_2$ layer into which nitrogen has been introduced. The scope of the formula $SiO_xN_y$ includes all combinations of integers x and y (or fractions thereof) at which $SiO_xN_y$ is stable. Rapid thermal tools, such as rapid thermal anneal (RTA), rapid thermal nitridation (RTN) and rapid thermal oxidation (RTO) tools share a common operating characteristics in that they all heat semiconductor substrates (wafers) to high temperatures (i.e., greater than 500° C.) in a chamber by the use of high intensity infrared lamps for very short periods of time (i.e., less than 60 seconds). The pressure and reactant gases let into the chamber determine the process, anneal, nitridation or oxidation that is performed. The temperature of an RTA, RTO or RTN is the maximum temperature that the wafer in the process chamber reaches.

Figure 1:
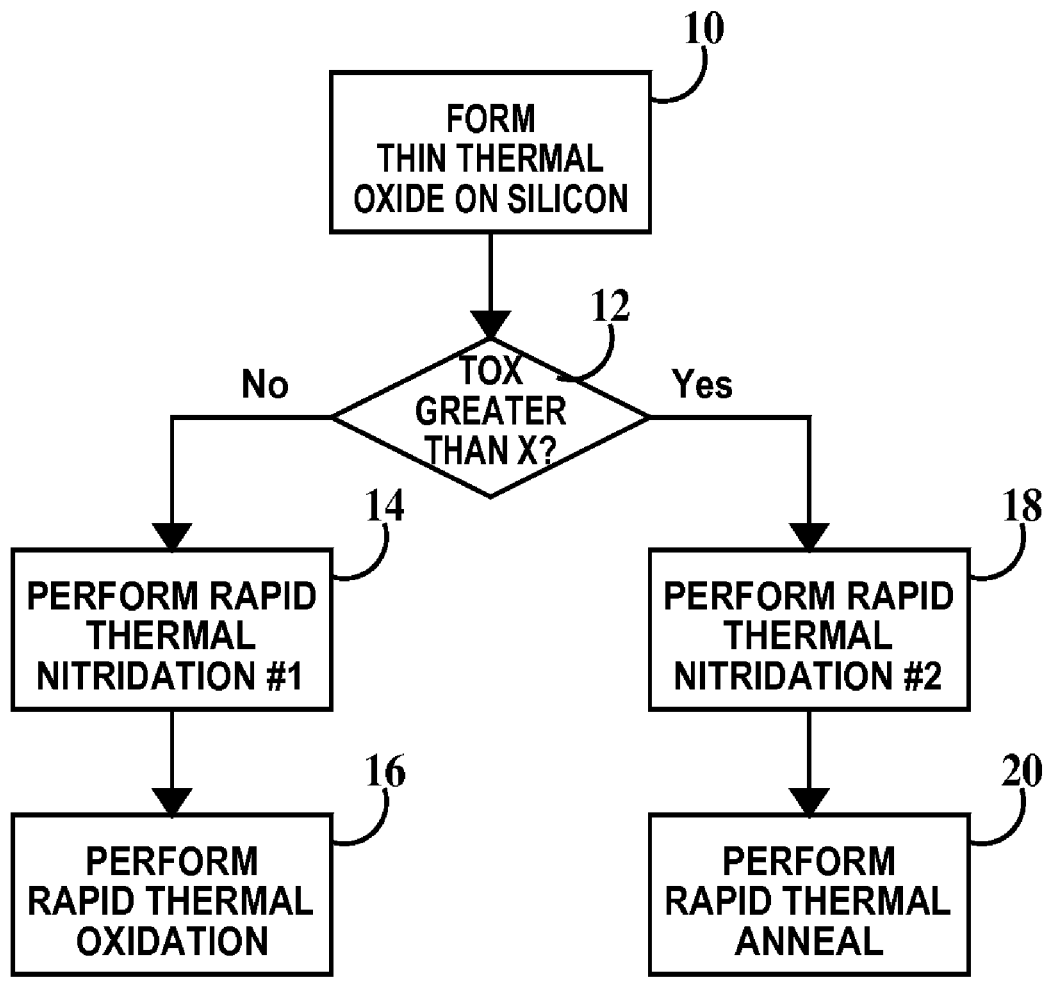
FIG. 1 is a flowchart describing the process steps for forming a nitrided silicon oxide layer according to first embodiments of the present invention.

FIG. 1 is a flowchart describing the process steps for forming a nitrided silicon oxide layer according to the embodiments of the present invention. A first embodiment of the present invention is used for forming an $SiO_xN_y$ layer in a lower thickness regime, while the second embodiment of the present invention is used for forming an $SiO_xN_y$ layer in a higher thickness regime. Step 10 is common to both embodiments of the present invention, while steps 14 and 16 apply to the first embodiment of the present invention and steps 18 and 20 apply to the second embodiment of the present invention.

In step 10, a silicon substrate (or silicon surface of an SOI substrate) is first cleaned using any one of a number of cleaning processes well known in the art. For example, the surface may be cleaned using a buffered hydrofluoric acid (BHF) clean followed by an $NH_4OH$ clean followed by an HCl clean. The cleaning removes any native oxide that may have formed on surface 32. Next a $SiO_2$ layer is thermally grown on the cleaned silicon surface. In one example, this oxidation step does not utilize a plasma.

In one example, an RTO is performed to form the $SiO_2$ layer on top of the silicon. In one example, the RTO is performed between about 900° C. and about 1100° C. In one example, the RTO is performed at a pressure between about 100 Torr and about 140 Torr. In one example, the RTO is performed for between about 5 seconds and about 10 seconds. In one example, the RTO is performed in an atmosphere containing between about 10% oxygen in nitrogen by volume to about 100% $O_2$. In one example, the thickness (Tox) of the $SiO_2$ layer is between about 11 Å and about 16 Å.

In step 12, the thickness of the $SiO_2$ is determined. If the thickness is not greater than a predetermined value "X" then the method proceeds to step 14. If the thickness is greater or equal to the predetermined value "X" then the method proceeds to step 18. In one example, X is about 13 Å.

The inventors have found, unexpectedly, that the thickness of the $SiO_2$ before nitridation can influence the across-wafer thickness uniformity of the resultant $SiO_xN_y$ to the point, that different nitridation processes are required in different thickness regimes and that a post-nitridation oxidation or anneal steps, again different for different thickness regimes, is also required for tight thickness uniformity control.

In step 14, an RTN process is performed in order convert the $SiO_2$ to $SiO_xN_y$. In one example, the RTN is performed at a temperature of less than or equal to 900° C. In one example, the RTN is performed at a temperature between about 825° C. and about 885° C. In one example, the RTN is performed at a pressure greater than about 500 Torr. In one example, the RTN is performed at a pressure between about 720 and about 760 Torr. In one example, the RTN is performed for between about 10 seconds and about 20 seconds. In one example, the source of nitrogen is ammonia ($NH_3$) gas. In one example, the RTN is performed at a pressure greater than about 500 Torr and at a temperature of less than or equal to about 900° C. in an $NH_3$ atmosphere. This RTN does not utilize a plasma.

Next, in step 16, an RTO process is performed. In one example, the RTO is performed at a temperature of less than or equal to 900° C. In one example, the RTO is performed at a temperature between about 875° C. and about 895° C. In one example, the RTO is performed at a pressure greater than about 500 Torr. In one example, the RTO is performed at a pressure between about 720 and about 760 Torr. In one example, the RTO is performed for between about 10 seconds and about 20 seconds. In one example, the RTO is performed in about 100% $O_2$. In one example, the RTO is performed at a pressure greater than about 500 Torr and at a temperature of less than about or equal to 900° C. in an $O_2$ atmosphere. This RTO does not utilize a plasma.

In one example, the $SiO_xN_y$ formed by the RTN process of step 14 in combination with the RTO process of step 16 contains between about 2% and about 20% nitrogen atoms. In one example, the $SiO_xN_y$ formed by the RTN process of step 14 in combination with the RTO process of step 16 contains between about 6% and about 8% nitrogen atoms. In one example, the concentration of nitrogen in the $SiO_xN_y$ formed by the RTN process of step 14 in combination with the RTO process of step 16 is between about 1E21 and about 1E22 $atm/cm^3$. In one example, the thickness (Tnox) of the $SiO_xN_y$ formed by the RTN process of step 14 in combination with the RTO process of step 16 is between about 11 Å and about 16 Å. Formation of the $SiO_xN_y$ layer is complete.

Returning to step 18, an RTN process is performed in order convert the $SiO_2$ to a nitrided $SiO_2$ or $SiO_xN_y$. In one example the RTN is performed at a temperature less than or equal to about 900° C. In one example, the RTN is performed at a temperature between about 850° C. and about 900° C. In one example, the RTN is performed at a pressure greater than about 500 Torr. In one example, the second RTN is performed at a pressure between about 720 and about 760 Torr. In one example, the RTN is performed for between about 10 seconds and about 20 seconds. In one example, the source of nitrogen is ammonia ($NH_3$) gas. In one example, the RTN is performed at a pressure greater than about 500 Torr and at a temperature of less than or equal to about 900° C. in an $NH_3$ atmosphere. This RTN does not utilize a plasma.

Next in step 20, an RTO is performed. In one example the RTO is performed at a temperature of less than 900° C. In one example, the RTO is performed at a temperature between about 850° C. and about 900° C. In one example, the RTO is performed at a pressure greater than about 500 Torr. In one example, the RTO is performed at a pressure between about 720 and about 760 Torr. In one example, the RTO is performed for between about 10 seconds and about 20 seconds. In one example, the RTO is performed in about 100% $N_2$. In one example, the RTO is performed in an atmosphere containing between about 10% by volume oxygen in nitrogen and about 100% nitrogen. In one example, the RTO is performed at a pressure greater than about 500 Torr and at a temperature of less than or equal to about 900° C. in a $N_2$ and $O_2$ atmosphere. This RTO may be considered an RTA since the oxygen concentration is very low (no greater than 10%) and is certainly an RTA when no oxygen is present.

In one example, the $SiO_xN_y$ formed by the RTN process of step 18 in combination with the RTO process of step 20 is between about 2% and about 20% nitrogen atoms. In one example, the $SiO_xN_y$ formed by the RTN process of step 18 in combination with the RTO process of step 20 is between about 6% and about 8% nitrogen atoms. In one example, the concentration of nitrogen in the $SiO_xN_y$ formed by the RTN process of step 18 in combination with the RTO process of step 20 is between about 1E21 and about 1E22 atm/cm³. In one example, the thickness (Tnox) of the $SiO_xN_y$ formed by the RTN process of step 18 in combination with the RTO process of step 20 is between about 11 Å and about 16 Å. Formation of the $SiO_xN_y$ layer is complete.

Table I illustrates the improved thickness control of the embodiments of the present invention over two different conventional plasma nitridation processes.

TABLE I

For an across wafer Tnox specification of between about 11 Å and about 16 Å; with tolerance of about +/−5% of target thickness

| Parameter | First Prior Art: Plasma Nitridation Process | Second Prior Art: Plasma Nitridation Process | Present Invention Sample #1 | Present Invention Sample #2 |
|---|---|---|---|---|
| Measured Standard deviation | 0.30 | 0.30 | 0.15 | 0.21 |
| Calculated Cp | 0.72 | 0.72 | 1.52 | 1.12 | where Cp is the process capability ratio which is defined as (the upper specification limit minus the lower specification limit) divided by six times the measured standard deviation. The number of measurements taken was about 500 measurements or more over multiple wafers from multiple lots per column.

Exemplary process conditions for the first embodiments of the present invention are given in Table II.

TABLE II

| Initial $SiO_2$ Thickness | RTN Conditions | RTO Conditions |
|---|---|---|
| 11 Å to 13 Å | 840–860° C., 740 Torr, 100% $NH_3$ 10–20 sec | 870–900° C., 740 Torr, 100% $O_2$ 5–20 sec |
| over 13 Å to 16 Å | 850–900° C., 740 Torr, 100% $NH_3$, 10–20 sec | 850–900° C., 740 Torr, 100% $O_2$ 5–25 sec |

In order to meet a 3-sigma specification limit, the value of Cp must be equal to or greater than 1. As can be seen from Table I, the prior art processes can not meet the specification limit of 0.53 and Tnox is greater than or equal to 11 Å and less than or equal to 16 Å, while the present invention does meet the specification.

Figure 2A:
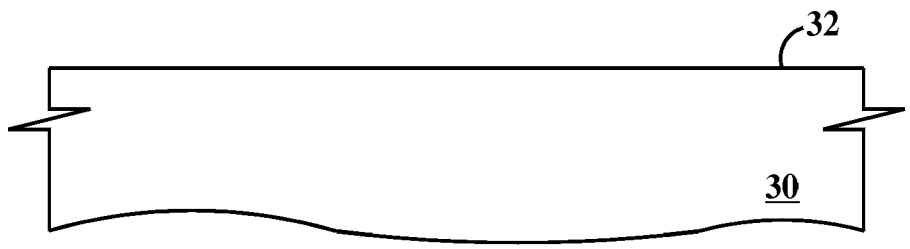
FIGS. 2A through 2D are cross-sectional views illustrating fabrication of a MOSFET having nitrided silicon oxide gate dielectric layer according to the present invention.
Figure 2B:
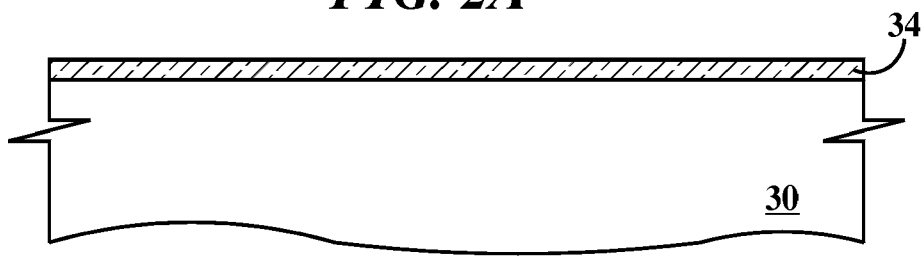

FIGS. 2A through 2D are cross-sectional views illustrating fabrication of a MOSFET having a nitrided silicon oxide gate dielectric layer according to the present invention. In FIG. 2A a substrate 30 having a top surface 32 is provided. Substrate 30 may be an intrinsic (undoped), N-type or P-type bulk silicon substrate or an intrinsic, N-type or P-type silicon on insulator (SOI) substrate. In FIG. 2B, a nitrided silicon-dioxide layer 34 formed according to the methods illustrated in FIG. 1 and described supra is formed.

Figure 2C:
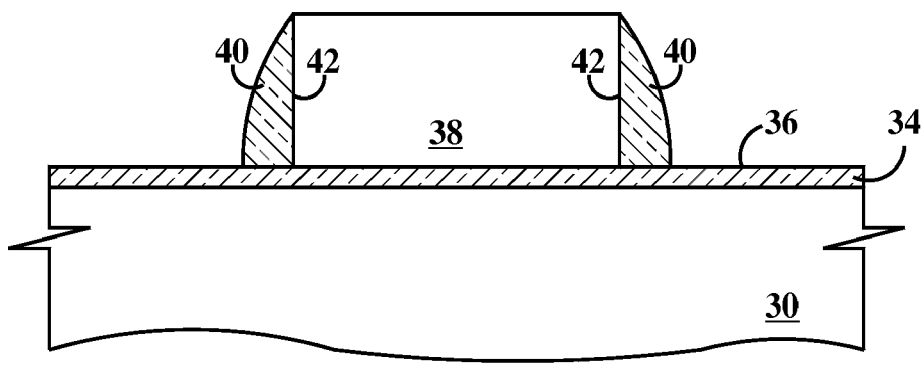

In FIG. 2C, a polysilicon gate 38 is formed on a top surface 36 of $SiO_xN_y$ layer 34. Polysilicon gate 38 may be formed using one of a number of deposition processes well known in the art, such as low-pressure chemical vapor deposition (LPCVD) or rapid thermal chemical vapor deposition (RTCVD) followed by photolithographic and reactive ion etch (RIE) processes. In one example, polysilicon gate 38 is about 300 Å to about 2000 Å thick. Next, spacers 40 are formed on sidewalls 42 of gate 38.

Figure 2D:
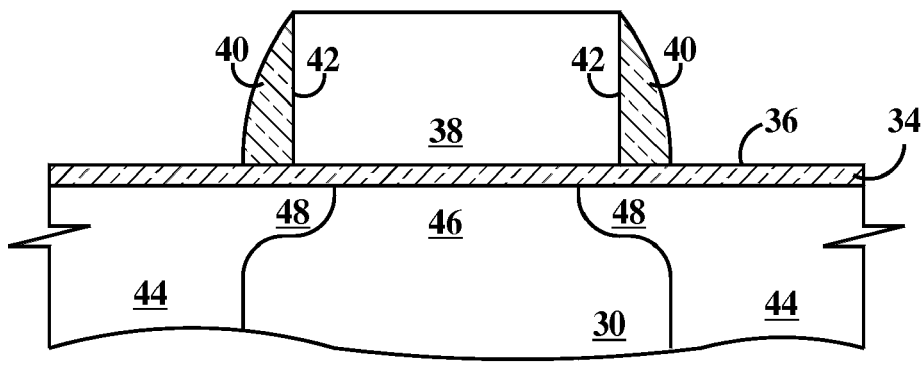

In FIG. 2D, source/drains 44 are formed on either side of a channel region 46. In one example source/drains 44 are formed by ion implantation of a dopant species.

Optionally, polysilicon gate 38 may also be implanted simultaneously with the ion implantation of source/drains 44. More than one ion-implantation, including angle ion-implantations called halo and extension ion implants to form regions 48 of the source drains that extend under gate 38. Multiple spacers may also be employed.

For p-channel field effect transistors (PFETs), source drains 44 (and optionally gate 38) be net doped P-type and channel region 46 net doped N type. For n-channel field effect transistors (NFETs), source drains 44 (and optionally gate 38) be net doped N-type and channel region 46 net doped P type. Suitable P-dopants include boron, and suitable N-dopants include arsenic and phosphorous.

The method of a fabricating a uniform thickness nitrided silicon oxide layer may also be performed using conventional furnaces (no plasma) instead of rapid thermal nitration and oxidation tools.

Process conditions for the second embodiments of the present invention are given in Table III.

TABLE III

| Initial $SiO_2$ Thickness | Furnace Nitridation Conditions | Furnace Oxidation Conditions |
|---|---|---|
| 10 Å to 13 Å | 840° C.–860° C., 1 Torr to 10 Torr, 10% to 100% $NH_3$, 30 min maximum | 600° C.–700° C., 10 Torr to 760 Torr, 10% to 100% $N_2O$, 120 min maximum |
| 10 Å to 13 Å | 550° C.–840° C., 1 Torr to 10 Torr, 10% to 100% $NH_3$, 120 min maximum | 700° C.–850° C., 10 Torr to 760 Torr, 10% to 100% $N_2O$, 30 min maximum |
| over 13 Å to 22 Å | 840° C.–860° C., 1 Torr to 10 Torr, 10% to 100% $NH_3$, 120 min maximum | 750° C.–850° C., 10 Torr to 760 Torr, 10% to 100% $N_2O$, 5 min maximum |
| over 22 Å to 26 Å | 840° C.–860° C., 10 Torr to 760 Torr, 10% to 100% $NH_3$, 120 min maximum | 750° C.–850° C., 10 Torr to 760 Torr, 10% to 100% $N_2O$, more than 5 minutes and no more than 10 min |

Mixtures of $O_2$ and an inert gas (e.g. Ar, He, $N_2$) or mixtures of NO and an inert gas (e.g. Ar, He, $N_2$) may be substituted for $N_2O$. All process temperatures are less than 860° C. Cps of these process combinations are greater than or equal to 1.

Thus, the present invention provides a method of fabricating a $SiO_xN_y$ dielectric layer having a relatively uniform across wafer thickness.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
    forming a silicon dioxide layer on a surface of a silicon substrate;
    performing a rapid thermal nitridation of said silicon dioxide layer at a temperature of less than or equal to about 900° C. and a pressure greater than about 500 Torr to completely convert said silicon dioxide layer to an initial nitrided silicon oxide layer, said rapid thermal nitridation performed without the use of a plasma; and
    performing a rapid thermal oxidation or anneal of said initial nitrided silicon oxide layer at a temperature of less than or equal to about 900° C. and a pressure greater than about 500 Torr to completely convert said initial nitrided silicon oxide layer to a final nitrided silicon oxide layer.

2. The method of claim 1, wherein said performing said rapid thermal nitridation is performed in an atmosphere containing ammonia.

3. The method of claim 1, wherein said performing said rapid thermal nitridation is performed in an essentially 100% ammonia atmosphere.

4. The method of claim 1, wherein said performing said rapid thermal oxidation or anneal is performed in a nitrogen atmosphere containing about 10% by volume or less of oxygen.

5. The method of claim 1, wherein said performing said rapid thermal oxidation or anneal is performed in an essentially 100% nitrogen atmosphere.

6. The method of claim 1, wherein said rapid thermal oxidation or anneal is performed without the use of a plasma.

7. The method of claim 1, wherein said silicon dioxide layer has a thickness between about 11 Å and about 16 Å.

8. The method of claim 1, wherein said final nitrided silicon oxide layer has a thickness between about 11 Å and about 16 Å.

9. The method of claim 1, wherein between about 2% and about 20% of all atoms of said final nitrided silicon oxide layer are nitrogen atoms.

10. The method of claim 1, wherein between about 6% and about 8% of all atoms of said final nitrided silicon oxide layer are nitrogen atoms.

11. The method of claim 1, wherein a nitrogen concentration of said final nitrided silicon oxide layer is between about 1E21 and about 1E22 $atm/cm^3$.

12. The method of claim 1, when a thickness of said silicon dioxide layer is not greater than about 13 Å, said performing said rapid thermal nitridation is performed at a temperature of between about 825° C. and about 885° C. and at a pressure of between about 720 and about 760 Torr in an ammonia containing atmosphere and said performing said rapid thermal oxidation or anneal is performed at a temperature of between about 875° C. and about 895° C. and at a pressure of between about 720 and about 760 Torr in an oxygen atmosphere.

13. The method of claim 1, further including:
    measuring said thickness of said silicon dioxide layer.

14. The method of claim 1, when a thickness of said silicon dioxide layer is greater than or equal to about 13 Å, said performing said rapid thermal nitridation is performed at a temperature of between about 850° C. and about 900° C. and at a pressure of between about 720 and about 760 Torr in an ammonia containing atmosphere and said performing said rapid thermal oxidation or anneal is performed at a temperature of between about 850° C. and about 900° C. and at a pressure of between about 720 and about 760 Torr in a nitrogen atmosphere containing no more than about 10% by volume of oxygen.

15. The method of claim 1, wherein said forming said silicon dioxide layer includes performing an initial rapid thermal oxidation.

16. The method of claim 15, wherein said initial rapid thermal oxidation is performed at a temperature of between about 900° C. and about 1100° C. and at a pressure of between about 100 and 140 Torr in an ammonia containing atmosphere containing between about 10% by volume oxygen in nitrogen and about 100% oxygen.

17. The method of claim 1, wherein said forming said silicon dioxide layer includes performing a thermal oxidation of said silicon substrate.

18. The method of claim 1, further including:
    forming a gate electrode over said final nitrided silicon oxide layer; and
    forming source/drains of a MOSFET in said silicon substrate on opposite sides of said gate electrode, said source drains separated by a channel region of said MOSFET, said channel region located in said substrate under said gate electrode.

19. The method of claim 1, wherein, an upper thickness specification limit of said final nitrided silicon oxide layer minus a lower thickness specification limit of said final nitrided silicon oxide layer divided by six times a standard deviation of across wafer thickness measurements of said final nitrided silicon oxide layer is equal to or greater than one.

20. A method, comprising:
    forming a silicon dioxide layer on a surface of a silicon substrate;
    based on a thickness of said silicon dioxide layer, either (i) selecting a first rapid thermal nitridation process and a first rapid thermal oxidation process or (ii) selecting a second rapid thermal nitridation process and a second rapid thermal oxidation or anneal process; and
    based on said thickness of said silicon dioxide layer either (iii) performing said first rapid thermal nitridation process on said silicon dioxide layer to completely convert said silicon dioxide layer to an initial nitrided oxide layer and performing said first rapid thermal oxidation process on said initial nitrided oxide layer to completely convert said initial nitrided oxide layer to a final nitrided silicon oxide layer, said first rapid thermal nitridation processes and said first rapid thermal oxidation processes performed at a temperature of less than or equal to about 900° C. and a pressure greater than about 500 Torr, or (iv) performing said second rapid thermal nitridation process on said silicon dioxide layer to completely convert said silicon dioxide layer to said initial nitrided oxide layer and performing said second rapid thermal oxidation or anneal process on said initial nitrided oxide layer to completely convert said initial nitrided silicon oxide layer to said final nitrided layer, said second rapid thermal nitridation processes and said second rapid thermal oxidation or anneal processes performed at a temperature of less than or equal to about 900° C. and a pressure greater than about 500 Torr.

21. The method of claim 20, wherein first or second rapid thermal nitridation process is performed in an atmosphere containing ammonia.

22. The method of claim 20, wherein said first or second rapid thermal nitridation process is performed in an essentially 100% ammonia atmosphere.

23. The method of claim 20, wherein said first rapid thermal oxidation or said second rapid thermal oxidation or anneal process is performed in a nitrogen atmosphere containing about 10% by volume or less of oxygen.

24. The method of claim 20, wherein said first rapid thermal oxidation or said second rapid thermal oxidation or anneal process is performed in an essentially 100% nitrogen atmosphere.

25. The method of claim 20, wherein said first or said second rapid thermal nitridation is performed without the use of a plasma.

26. The method of claim 20, wherein said first rapid thermal oxidation or said second rapid thermal oxidation or anneal process is performed without the use of a plasma.

27. The method of claim 20, wherein said silicon dioxide layer has a thickness between about 11 Å and about 16 Å.

28. The method of claim 20, wherein said final nitrided silicon oxide layer has a thickness between about 11 Å and about 16 Å.

29. The method of claim 20, wherein between about 2% and about 20% of all atoms of said final nitrided silicon oxide layer are nitrogen atoms.

30. The method of claim 20, wherein between about 6% and about 8% of all atoms of said final nitrided silicon oxide layer are nitrogen atoms.

31. The method of claim 20, wherein a nitrogen concentration of said final nitrided silicon oxide layer is between about 1E21 and about 1E22 atm/cm$^3$.

32. The method of claim 20, when said thickness of said silicon dioxide layer is not greater than about 13 Å, performing said first rapid thermal nitridation process and said first rapid thermal oxidation process, said first rapid thermal nitridation process performed at a temperature of between about 825° C. and about 885° C. and at a pressure of between about 720 and about 760 Torr in an ammonia containing atmosphere and said first rapid thermal oxidation process performed at a temperature of between about 875° C. and about 895° C. and at a pressure of between about 720 and about 760 Torr in an oxygen atmosphere.

33. The method of claim 20:
measuring said thickness of said silicon dioxide layer.

34. The method of claim 20, when said thickness of said silicon dioxide layer is greater than or equal to about 13 Å, performing said second rapid thermal nitridation process is performed at a temperature of between about 850° C. and about 900° C. and at a pressure of between about 720 and about 760 Torr in an ammonia containing atmosphere and said performing said second rapid thermal oxidation or anneal process is performed at a temperature of between about 850° C. and about 900° C. and at a pressure of between about 720 and about 760 Torr in a nitrogen atmosphere containing no more than about 10% by volume of oxygen.

35. The method of claim 20, wherein said forming said silicon dioxide layer includes performing an initial rapid thermal oxidation.

36. The method of claim 35, wherein said initial rapid thermal oxidation is performed at a temperature of between about 900° C. and about 1100° C. and at a pressure of between about 100 and 140 Torr in an ammonia containing atmosphere containing between about 10% by volume oxygen in nitrogen and about 100% oxygen.

37. The method of claim 20, wherein said forming said silicon dioxide layer includes performing a thermal oxidation of said silicon substrate.

38. The method of claim 20, further including:
forming a gate electrode of a MOSFET over said nitrided silicon oxide layer; and
forming source/drains of said MOSFET in said silicon substrate on opposite sides of said gate electrode, said source drains separated by a channel region of said MOSFET, said channel region located in said substrate under said gate electrode.

39. The method of claim 20, wherein, an upper thickness specification limit of said final nitrided silicon oxide layer minus a lower thickness specification limit of said final nitrided silicon oxide layer divided by six times a standard deviation of across wafer thickness measurements of said final nitrided silicon oxide layer is equal to or greater than one.

40. A method, comprising:
forming a silicon dioxide layer on a surface of a silicon substrate;
selecting a furnace nitridation process and a corresponding furnace oxidation process from two or more sets of furnace processes based on a thickness of said silicon dioxide layer; and
performing said selected furnace nitridation process on said silicon dioxide layer to form an initial nitrided silicon oxide layer and performing said selected furnace oxidation process on said initial nitrided oxide layer to form a final nitrided silicon oxide layer, said selected furnace nitridation process and said selected furnace oxidation process performed at a temperature from 650° C. to 850° C. and said selected furnace oxidation process performed at a pressure from 10 Torr and 760 Torr.

41. The method of claim 40, wherein said selected furnace nitridation and said selected furnace oxidation are each performed without the use of a plasma.

42. The method of claim 41, when a thickness of said silicon dioxide layer is from 10 Å to 13 Å, said performing said furnace nitridation is performed at a temperature of between 840° C. and 860° C. and at a pressure of from 1 Torr to 10 Torr in an ammonia containing atmosphere and said performing said furnace oxidation is performed at a temperature of between 600° C. and 700° C. and at a pressure of from 10 Torr to 760 Torr in an atmosphere containing $O_2$, $N_2O$ or NO.

43. The method of claim 41, when a thickness of said silicon dioxide layer is from 10 Å to 13 Å, said performing said furnace nitridation is performed at a temperature of between 550° C. and 840° C. and at a pressure of from 1 Torr to 10 Torr in an ammonia containing atmosphere and said performing said furnace oxidation is performed at a temperature of between 700° C. and 850° C. and at a pressure of from 10 Torr to 760 Torr in an atmosphere containing $O_2$, $N_2O$ or NO.

44. The method of claim 41, when a thickness of said silicon dioxide layer is over 13 Å to 22 Å, said performing said furnace nitridation is performed at a temperature of between 840° C. and 860° C. and at a pressure of from 1 Torr to 10 Torr in an ammonia containing atmosphere and said performing said furnace oxidation is performed at a temperature of between 750° C. and 850° C. and at a pressure of from 10 Torr to 760 Torr in an atmosphere containing $O_2$, $N_2O$ or NO.

45. The method of claim 41, when a thickness of said silicon dioxide layer is over 22 Å to 26 Å, said performing said furnace nitridation is performed at a temperature of between 840° C. and 860° C. and at a pressure of from 10 Torr to 760 Torr in an ammonia containing atmosphere and said performing said furnace oxidation is performed at a temperature of between 750° C. and 850° C. and at a pressure of from 10 Torr to 760 Torr in an atmosphere containing $O_2$, $N_2O$ or NO.

* * * * *